United States Patent [19]

Frey

[11] Patent Number: 4,471,320

[45] Date of Patent: Sep. 11, 1984

[54] VOLTAGE CONTROLLED ELEMENT

[76] Inventor: Douglas R. Frey, 1980C Allwood Dr., Bethlehem, Pa. 18018

[21] Appl. No.: 267,691

[22] Filed: May 27, 1981

[51] Int. Cl.³ .......................... H03F 3/45; H03G 3/10
[52] U.S. Cl. .................................. 330/254; 330/261; 330/285
[58] Field of Search ............... 330/252, 254, 259, 260, 330/261, 278–279, 285

[56] References Cited

U.S. PATENT DOCUMENTS

| | | | |
|---|---|---|---|
| 3,908,172 | 9/1975 | Aschermann et al. | 330/254 |
| 4,092,612 | 5/1978 | Schade | 330/288 |
| 4,157,512 | 6/1979 | Schmoock | 330/260 |
| 4,205,275 | 5/1980 | Blackburn . | |
| 4,216,436 | 8/1980 | Lefferts . | |
| 4,227,095 | 10/1980 | Bazil . | |

FOREIGN PATENT DOCUMENTS 2755827 6/1979 Fed. Rep. of Germany ...... 330/254

OTHER PUBLICATIONS

David Baskind & Harry Rubens, "Techniques for the Realization and Application of Voltage Controlled Amplifiers and Attenuators", presented at 60th Convention, May 2–5, 1978, Los Angeles Audio Engineering Soc.

Douglas R. Curtis, "A Monolithic Voltage Controlled Amplifier Employing Log-Antilog Techniques", *Journal of the Audio Engineering Society*, Mar. 1976, vol. 24, No. 2.

Primary Examiner—James B. Mullins
Assistant Examiner—G. Wan
Attorney, Agent, or Firm—Charles N. Quinn

[57] ABSTRACT

A voltage controlled element includes first and second pairs of transistors where bases of two of the transistors are connected to a reference voltage and bases of the remaining two transistors are connected to a control signal, emitters of transistors of respective pairs are connected together, differences in collector currents between transistors of said pairs define output signals from said element, including feedback means for providing as a portion of a signal input to means for drawing currents from said connected emitters signal outputs of said element.

28 Claims, 5 Drawing Figures

VOLTAGE CONTROLLED ELEMENT

BACKGROUND OF THE INVENTION

1. Field of the Invention

This invention relates to voltage controlled elements useful as voltage controlled amplifiers and/or potentiometers.

2. Description of the Prior Art

Multiplier circuits, amplifier circuits and attenuator circuits are disclosed in U.S. Pat. Nos. 3,714,462; 4,155,047; 4,157,512; 4,163,197; 4,169,247; 4,177,432, 4,180,780 and 4,187,472. Such circuits have also been disclosed in the article "Designers' Guide to: Basic AGC Amplifier Design" appearing in the Jan. 20, 1974 issue of *Electronic Design News*, the article "Voltage-Controlled Amplifier Covers 70 db Range" appearing in the Mar. 5, 1975 issue of *Electronic Design News*, the article "Linear Voltage-Controlled Attenuator-DC to 20 kHz" appearing in the March 1976 issue of *Electronic Engineering*, the article "A Monolithic Voltage-Controlled Amplifier Employing Log-Antilog Techniques" appearing in the March 1976 issue of the *Journal of the Audio Engineering Society*, the article "A Multiplex Remote-Control System" appearing in the September 1977 issue of the *Journal of the Audio Engineering Society*, the article "Current-Compensated Op Amp Improves OTA Linearity" appearing in the Mar. 17, 1977 issue of *Electronics*, in the paper entitled "Techniques for the Realization and Application of Voltage Controlled Amplifiers and Attenuators" presented at the Audio Engineering Society Convention in May of 1978 at Los Angeles, Calif. and in the paper entitled "The Design and Integration of a High Performance Voltage Controlled Attenuator" presented at the Audio Engineering Society Convention in November, 1979 in New York City.

Patents disclosing use of feedback to improve circuit performance include U.S. Pat. Nos. 4,163,948; 4,197,426 and 4,201,888. Use of feedback to improve circuit performance is also disclosed in the paper "Multipurpose Hardware for Digital Coding of Audio Signals" presented at the National Telecommunications Conference held December, 1977 in Los Angeles and in the paper "Electronically Tunable RC Sinusoidal Oscillators" published in the June, 1975 *IEEE Transactions on Instrumentation and Measurement*.

Also of interest is the product bulletin entitled "Engineering Data—Allison EGC-101 and Related Circuits" distributed by Valley People, Incorporated, P.O. Box 40306, 2028 Erica Place, Nashville, Tenn., 37204, disclosing substantially the circuits disclosed in the '462 patent.

The '047 and '462 patents are believed of greatest relevance of this invention.

The '047 circuit is a multiplier circuit accepting as input a differential input current and developing a differential output voltage proportional to the input current. Gain is determined by a control voltage establishing a bias on the transistor pairs, causing emitter current to split predictably. Various support circuitry may be used to convert a single input signal to a differential input current and to convert the differential outputs to a single signal.

The '047 circuit unfortunately requires extreme matching between left and right components. Without close matching, direct current appears in the output with the direct current component being dependent on the control voltage, i.e. control voltage feedthrough results. Moreover, thermal drifts can cause circuit output to drift unacceptably. A further disadvantage of the '047 circuit is the lack of log conformity in the gain control. This lack of conformity is particularly apparent near maximum gain. Still further, the maximum gain available with the central portion of the '047 circuit is unity. Gain can be introduced to the output stage, but, unfortunately, this leads to degradation in the signal-to-noise ratio.

An additional disadvantage of circuits of the '047 type is caused by noise of the central transistors; output noise may be sufficient that the equivalent input noise is unacceptably high, making such circuits inoperable with small signals.

OBJECTS OF THE INVENTION

This invention seeks to provide a high quality voltage controlled element, improved over the core circuit disclosed in '047, useful as a voltage controlled amplifier and as a voltage controlled potentiometer. Additional objects of the invention are to provide a voltage controlled element which:

(a) exhibits low distortion—less than 0.1%;
(b) has improved noise characteristics, making the voltage controlled element useful with small signals;
(c) practically eliminates control voltage feedthrough and output DC offset drift;
(d) can be implemented with NPN transistors exclusively, PNP transistors exclusively, or with a mixture of NPN and PNP transistors;
(e) does not require a high degree of matching between a number of component pairs; and
(f) can be operated in Class A or AB.

SUMMARY OF THE INVENTION

In one aspect, this invention provides a voltage controlled element which includes first and second pairs of transistors, each transistor having a base, an emitter and a collector, where the second transistors of each pair may have bases connected together and to a reference voltage while bases of first transistors of the pairs are connected to a control signal, emitters of the transistors of the respective pairs are connected together with respective paired emitters being connected to respective current production means which draw respective currents from the respective connected emitters differing by an amount proportional to a control signal input to the element, the difference in collector currents of the first transistors of the pairs defining a first output signal and the difference in collector currents of the second transistors of the pairs defining a second output signal and including means for producing a signal input to the current production means in response to the combination of at least one of said output signals and an arbitrary input.

In another aspect of the invention, bases of first transistors of the pairs are connected to a control signal, bases of second transistors of the pairs are connected to a reference voltage, collectors of first transistors of the respective pairs are connected with collectors of second transistors of the remaining pairs, emitters of transistors of the second pair being connected together and to a current source, emitters of transistors of the first pair being connected together and to a reference supply voltage, with current from connected collectors of said first transistor of said second pair and said second transistor of said first pair defining a first output signal and current from connected collectors of said first transistor of said first pair and said second transistor of said second pair defining a second output signal and including means for producing signal input to the current production means in response to combination of at least one of said output signals and an arbitrary input.

The voltage controlled element is configured as a multiplier circuit and can be used as a voltage controlled amplifier or potentiometer. The circuit may be implemented with all NPN transistors, all PNP transistors or with a mixture of NPN and PNP transistors. The transistors may be mounted on a common substrate and, consequently, the circuit may be fabricated monolithically.

DESCRIPTION OF THE PREFERRED EMBODIMENTS

Figure 1:
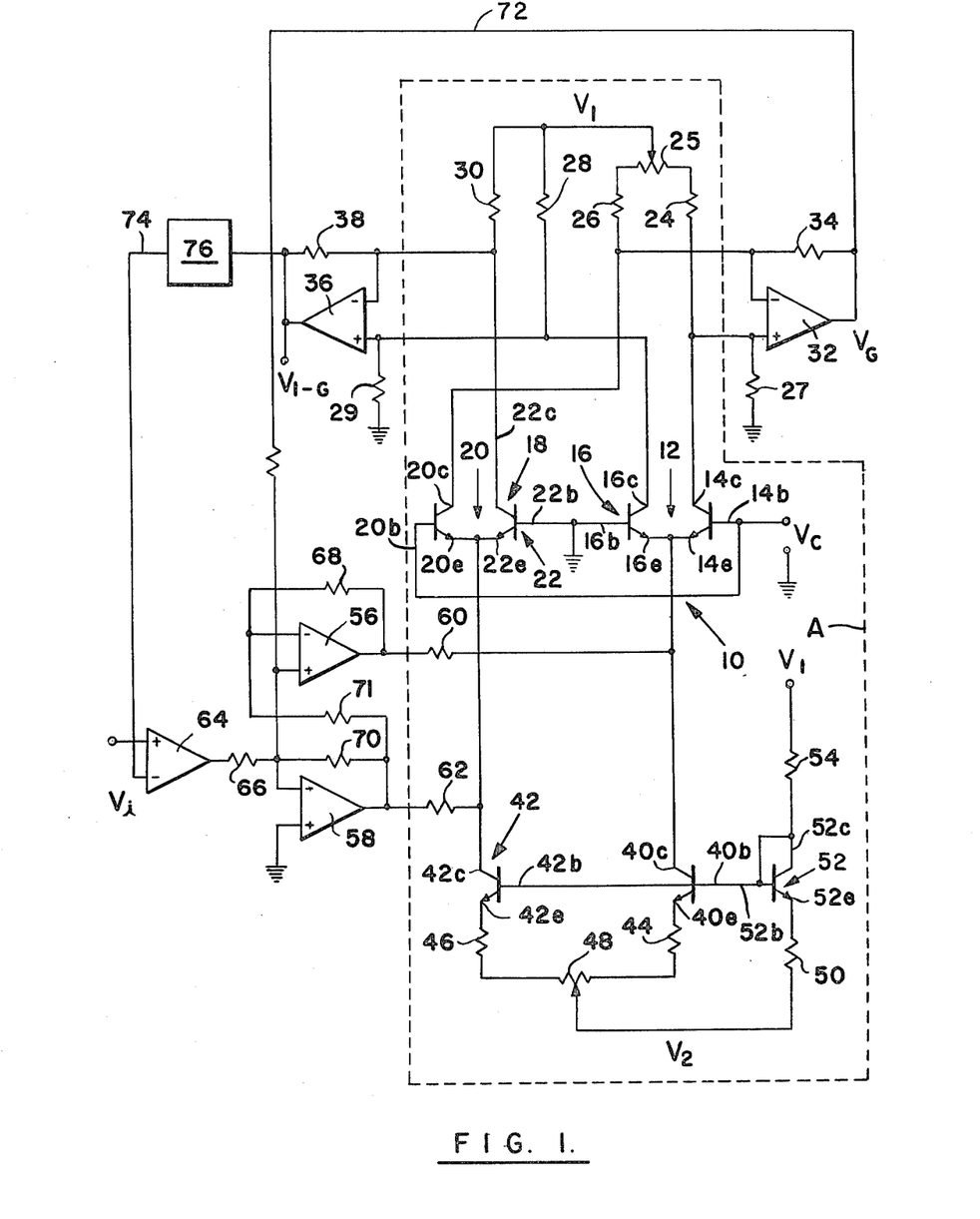
FIG. 1 is a schematic representation of a circuit embodying the invention, implemented with NPN core transistors.

Referring to FIG. 1, a voltage controlled multiplier circuit to which this invention relates is designated generally 10 and is within rectangle A. Circuit 10 includes a first pair 12 of NPN-type transistors with the first transistor of pair 12 denoted 14 and the second transistor of pair 12 denoted 16. A second pair of NPN-type transistors is denoted 18 and includes a first transistor 20 and a second transistor 22.

Transistors 14, 16, 20, 22 each have a base, an emitter and a collector indicated by letters b, e and c respectively; accordingly, 14e denotes the emitter of transistor 14. Second transistors 16, 22 have their respective bases 16b, 22b connected together and to ground. Emitters 14e, 16e of transistors 14, 16 of first pair 12 are connected together; similarly, emitters 20e, 22e of transistors 20, 22 of second pair 18 are connected. Bases 14b, 20b are connected commonly to a control voltage $V_c$; gain of the circuit element is proportional to control voltage $V_c$.

The control voltage $V_c$ represents a difference in voltage potential between the two pairs of connected bases. Specifically, bases of transistors 16, 22 need not be grounded; bases of transistors 16, 22 and of transistors 14, 20 must, however, be maintained at different voltage potentials. $V_c$ is obtained by applying a voltage difference between connected bases 16b, 22b and 14b, 20b. Any suitable means may be used to apply the required voltage difference.

Resistors 28, 30 are connected between collectors 16c, 22c of second transistors 16, 22 and a reference voltage $V_1$. Resistors 24, 26 are connected between collectors 14c, 20c of first transistors 14, 20 and a trim pot 25 having a tap connected to reference voltage $V_1$. During operation the difference in currents from collectors 14c, 20c defines a first intermediate output while the difference in currents from collectors 16c, 22c defines a second intermediate output. The sum of the intermediate outputs is a constant times the input to the voltage controlled multiplier within rectangle A.

A first differential amplifier 32 in combination with associated resistors 24, 25, 26, 27, 34 converts the first intermediate output from collectors 14c, 20c to a first output voltage $V_G$ proportional to gain, G, of the circuit shown in FIG. 1. The product of gain G and the input voltage $V_i$ defines the first output voltage $V_G$. Of course, $V_G$ is also affected by the values chosen for the various feedback elements, resistors and the like. Resistor 27 connects the positive input terminal of first differential amplifier 32 to ground while resistor 34 connects the negative input terminal of first differential amplifier 32 to output thereof.

A second differential amplifier 36 in combination with associated resistors 28, 29, 30, 38 converts the second intermediate output from collectors 16c, 22c to a second output voltage $V_{1-G}$ proportional to a constant minus the gain G. Resistor 29 connects the positive input terminal of second differential amplifier 36 to ground while resistor 38 connects the negative input terminal of second differential amplifier 36 to the output thereof.

As used herein, gain G of the multiplier circuit enclosed within dash line A is the ratio of the emitter current at emitter 14e of first transistor 14 of first pair 12 to the sum of the currents from emitters 14e, 16e of first and second transistors 14, 16 of first pair 12. This current ratio defining gain G is the same for each of the pairs 12, 18 of transistors, i.e. ratio of current from emitter 14e to the sum of currents from emitters 14e, 16e is the same as the ratio of current from emitter 20e to the sum of currents from emitters 20e, 22e.

Transistors 40, 42 have their respective collectors 40c, 42e connected respectively to connected emitters 14e, 16e and 20e, 22e of first and second pairs of transistors 12, 18; consequently transistors 40, 42 act as current sources respectively drawing currents from respective connected emitters 14e, 16e and 20e, 22e. Emitters 40e, 42e are connected via respective resistors 44, 46 to a variable resistor 48 having its tap connected to reference voltage $V_2$. Variable resistor 48 is useful in balancing the circuit under certain optional feedback conditions determined by the character of feedback element 76. Resistor 50 connects reference voltage $V_2$ to an emitter 52e of seventh transistor 52; the base and collector of seventh transistor 52 and the bases of transistors 40, 42 are connected via resistor 54 to reference voltage $V_1$.

Current source transistors 40, 42 provide equal DC bias curents for transistor pairs 12, 18. This causes currents to flow through respective connected emitters 14e, 16e and 20e, 22e differing by an amount proportional to the voltages applied by third and fourth differential amplifiers 56, 58 respectively. Amplifiers 56, 58 are connected to respective connected emitters 14e, 16e and 20e, 22e via resistors 60, 62 respectively.

A fifth amplifier 64 receives input voltage $V_i$ and supplies as output a signal input to third and fourth amplifiers 56, 58 via resistor 66. Resistors 68, 70 respectively provide feedback of the output from amplifiers 56, 58 to the negative input terminals thereto. Output of fourth amplifier 58 is provided via resistor 71 as input to third amplifier 56.

Line 72 provides output of first amplifier 32 as input to respective positive and negative terminals of third and fourth amplifiers 56, 58. Similarly, line 74 provides output of second amplifier 36 as input to the negative terminal of fifth amplifier 64, with a feedback connection 76 provided therebetween. Feedback connection 76 may be an active or passive network of components, for example a voltage divider.

During operation, the combination of third and fourth amplifiers 56, 58 acting with seventh transistor 52 on fifth and sixth transistors 40, 42 causes differential input current to flow from connected emitters 14e, 16e and 20e, 22e with the circuit developing respective differential output currents from collectors 14c and 20c and from collectors 16c and 22c which are proportional to the differential input current. Respective gains are determined by the control voltage $V_c$ applied to bases 14b, 20b of transistors 14, 20. Control voltage $V_c$ establishes bias on transistor pairs 12, 18, causing emitter current to split predictably.

Adding line 72 provides improved log conformity and causes equivalent input noise to drop as circuit gain becomes more and more positive as controlled by magnitude of $V_c$.

When line 72 is included, gain of the circuitry associated with amplifiers 32, 56, 58 may be chosen so that output of amplifier 36 is always as constant times the voltage at the output of amplifier 64.

When line 74 is added, providing a second feedback path having gain determined by feedback connection 76, drift and mismatch characteristics of amplifiers 56, 58, transistors 40, 42, 52 and the associated resistors are greatly reduced, effectively confining mismatch and drift to the first stage of the circuit, i.e. amplifier 64, reducing overall thermal drift. Inclusion of line 74 results in log conformity of the circuit being unaffected by inaccuracies in feedback gains and reduces control voltage feedthrough. To balance the circuit for minimum DC shift in the output as control voltage $V_c$ varies, the tap on variable resistor 25 is adjusted; negative feedback provided by line 74 and feedback connection 76 overcomes other inaccuracies.

$V_1$ and $V_2$ are supply voltages. $V_1$ and $V_2$ may be furnished from any suitable power supply and may also be used to power the differential amplifiers.

Figure 2:
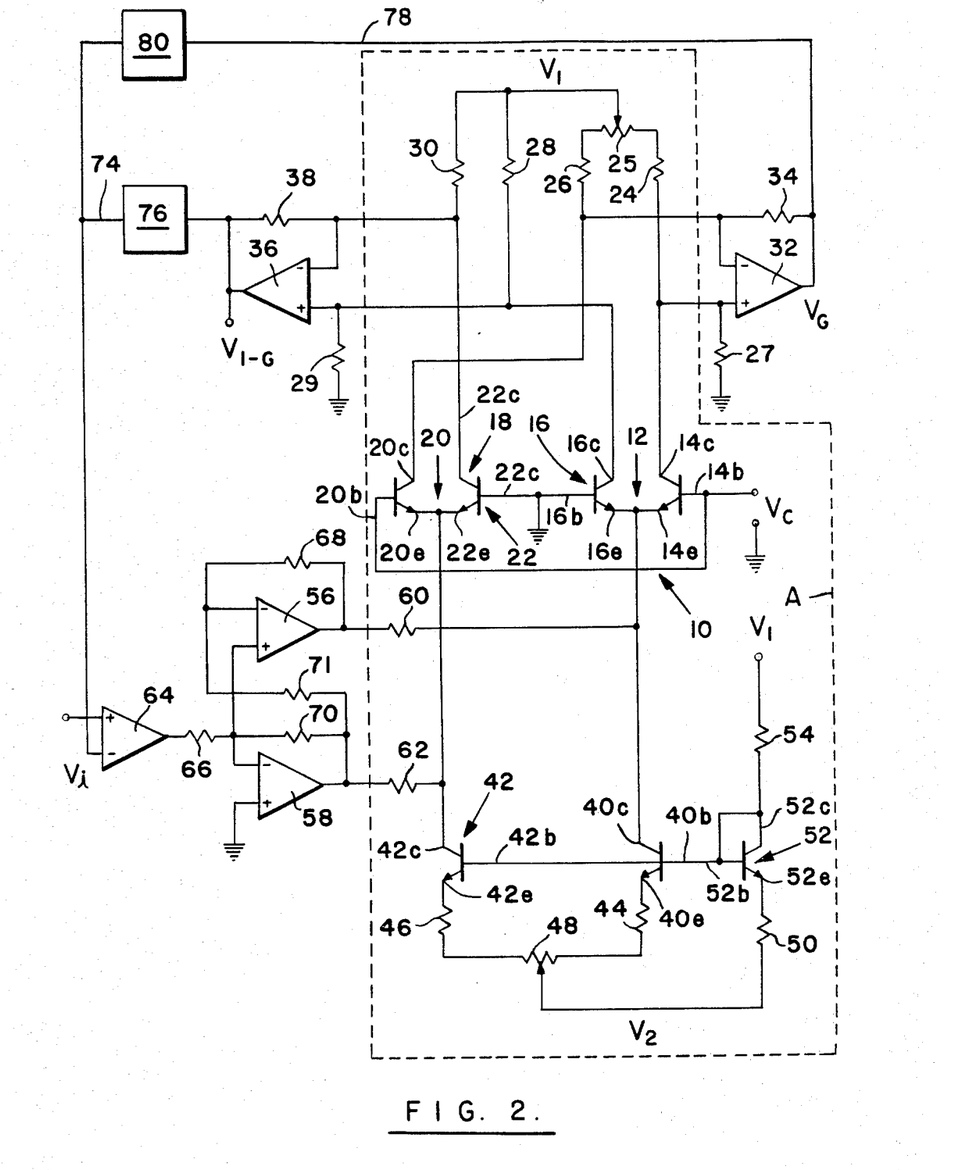
FIG. 2 is a schematic representation of a second circuit embodying the invention, implemented with NPN core transistors.

FIG. 2 shows another embodiment of circuitry manifesting aspects of the invention where the multiplier circuit defined by dash line A is as disclosed in FIG. 1. The circuit of FIG. 2 differs in that line 72 present in FIG. 1 has been eliminated. Substituted for line 72 is a line 78 and a feedback connection 80 providing output of first amplifier 32 for combination with output from second amplifier 36 after these respective output signals have been processed by feedback connections 80, 76. The combined output signal, after processing, is provided as input to the negative input terminal of fifth differential amplifier 64. Feedback connection element 80 may be of the same type as element 76, discussed above.

The circuit of FIG. 2 embodies the advantages described for the circuit of FIG. 1. However, the circuit of FIG. 1 has potential for increased bandwidth over the circuit of FIG. 2. The circuit of FIG. 2 can operate effectively as a voltage controlled potentiometer where the sum of the outputs $V_G$, $V_{1-G}$ is a constant times the input, regardless of control voltage $V_c$.

Figure 3:
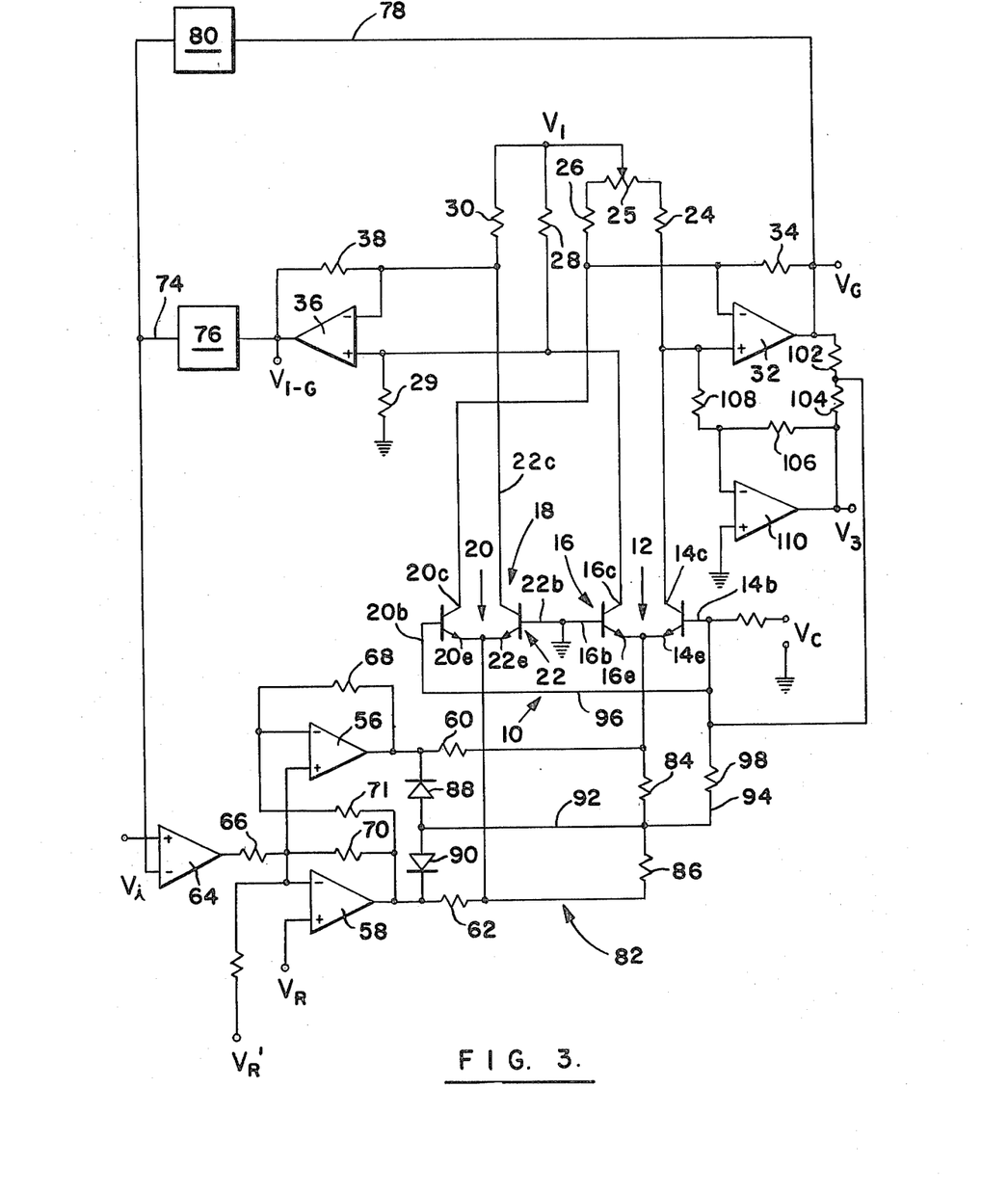
FIG. 3 is a modification of the circuit in FIG. 2.

FIG. 3 illustrates a modification of the circuit of FIG. 2 in which the multiplier circuit is operable in Class AB. In FIG. 3, the circuit elements are substantially as shown in FIG. 2, with the exception that fifth, sixth and seventh transistors 40, 42, 52 and their associated resistors 44, 46, 48, 50 and 54, have been eliminated and a resistor-diode network denoted generally 82 has been substituted therefor; additionally, two reference voltages $V_R$ and $V_R'$ are supplied as input to third and fourth amplifiers 56, 58. Resistor-diode network 82 includes resistors 84 and 86, and diodes 88 and 90 connecting a bridge line 92 from a point intermediate resistors 84, 86 with outputs of third and fourth amplifiers 56, 58. Network 82 in combination with amplifiers 56, 58 biases the transistors of pairs 12, 18 so that emitter current therefrom is much smaller than in the circuits of FIGS. 1 and 2 but does not go to zero. The resultant Class AB operation permits reduction of equivalent input noise by as much as 15 dB, or more, over the Class A case. Application of reference voltages $V_R$ and $V_R'$ to third and fourth amplifiers 56, 58 causes amplifiers 56, 58 to generate the common mode current required so that the emitter currents from transistor pairs 12, 18 do not reach zero, thereby assuring Class AB operation.

A disadvantage attendant to Class AB operation is that distortion increases due to effects which are not cancelled by negative feedback provided by lines 74, 78. To reduce distortion, the circuit control port defined by connected transistor bases 14b, 20b is modulated by feeding a portion of the common mode current and a portion of the circuit signal output produced at first amplifier 32 to connected bases 14b, 20b.

Control port modulation is achieved by connecting the junction of bridge line 92 intermediate resistors 84, 86 to line 96 connecting bases 14b and 20b via resistor 98. Resistors 106, 108 in combination with sixth differential amplifier 110 produce a voltage $V_3$ at the output of amplifier 110 proportional to the voltage at collector 14c of transistor 14. Voltage $V_3$ is connected via resistor 104 with voltage $V_G$ received via resistor 102; this combined voltage from intermediate resistors 102, 104 is combined with voltage from intermediate resistors 84, 86 as received via resistor 98 and the resultant combination is connected to $V_c$ thereby to produce a correction to control voltage $V_c$ applied to bases 14b, 20b of transistors 14, 20.

When no signal is applied to the circuit of FIG. 3, a small amount of current is still drawn from the connected emitters of each of the respective transistor pairs 12, 18. When a large signal is then applied, this would, but for diodes 88, 90, cause one of pairs 12, 18 to have a greater amount of current drawn through it while the remaining pair would have no current drawn through. The configuration of diodes 88, 90, however, is such that one of the diodes 88, 90 will turn on and pull an extra amount of current through resistors 84, 86, to guarantee that extra current flows, in addition to the signal currents, in both of the respective pairs 12, 18. The additional component of current guarantees that the transistor pair 12 or 18 which might have turned off will not turn off because of the additional current added.

Amplifiers 56 and 58 operate with equal and opposite signal components in them. When no signal is applied, reference voltages $V_R$ and $V_R'$ create a slight negative potential at the output of both amplifier 56 and amplifier 58. With a signal applied, output of amplifier 56, for example, might go slightly above the previous negative potential, while output of amplifier 58 will go slightly below the previous negative potential. In such event amplifier 56 would tend to turn off transistor pair 12 to which amplifier 56 is connected, while amplifier 58 would tend to pull more current from transistor pair 18 to which amplifier 58 is connected. Just before the time when transistor pair 12 connected to amplifier 56 would begin to be starved of current, diode network 82 will turn on with diode 90 operating to permit current flow therethrough thereby to cause current to flow through both resistors 84 and 86, thereby augmenting current flow through both transistor pairs 12 and 18 to assure that current flow through transistor pair 12 connected to amplifier 56 would not go to zero. This defines Class AB operation for the circuit of FIG. 3.

A common mode voltage appearing intermediate resistors 84 and 86 enables effective Class AB operation. The common mode voltage must be summed with another signal—for example, the output of first amplifier 32—to modulate the control port to reduce distortion. In creating control port modulation it is also required to apply a portion of gain G multiplied by the common mode voltage which, in FIG. 3, is voltage at output of amplifier 110. Voltage at the positive terminal of amplifier 32 in FIG. 3 contains a component which is proportional to the common mode voltage and contains a signal output component. At the juncture between resistors 102 and 104, the signal component of that voltage is cancelled so that the circuit combines only the product of the element gain and the common mode voltage; this reduces the distortion. This combining is accomplished by connection of line 100 via resistor 98 with the point intermediate resistors 84, 86, and providing this combination to line 96 connected to the control port where $V_c$ is applied.

Modulating the control port utilizing circuitry illustrated in FIG. 3 results in an order of magnitude improvement in distortion performance. This method may also be used in Class A circuits.

A circuit substantially as disclosed in FIG. 3, when tested, has displayed −97 dBv equivalent input noise at unity gain and −103 dBv equivalent input noise at gain of 20 dB. Distortion at all input and output levels has been less than 0.1%. Control voltage feedthrough has been trimmed to under one millivolt with a 10 KHz control voltage switching sinusoidally between plus and minus 20 dB of gain.

While the circuits of FIGS. 1, 2 and 3 have been illustrated with all NPN transistors in the transistor pairs 12, 18, similar configurations utilizing PNP transistors may be substituted.

Figure 4:
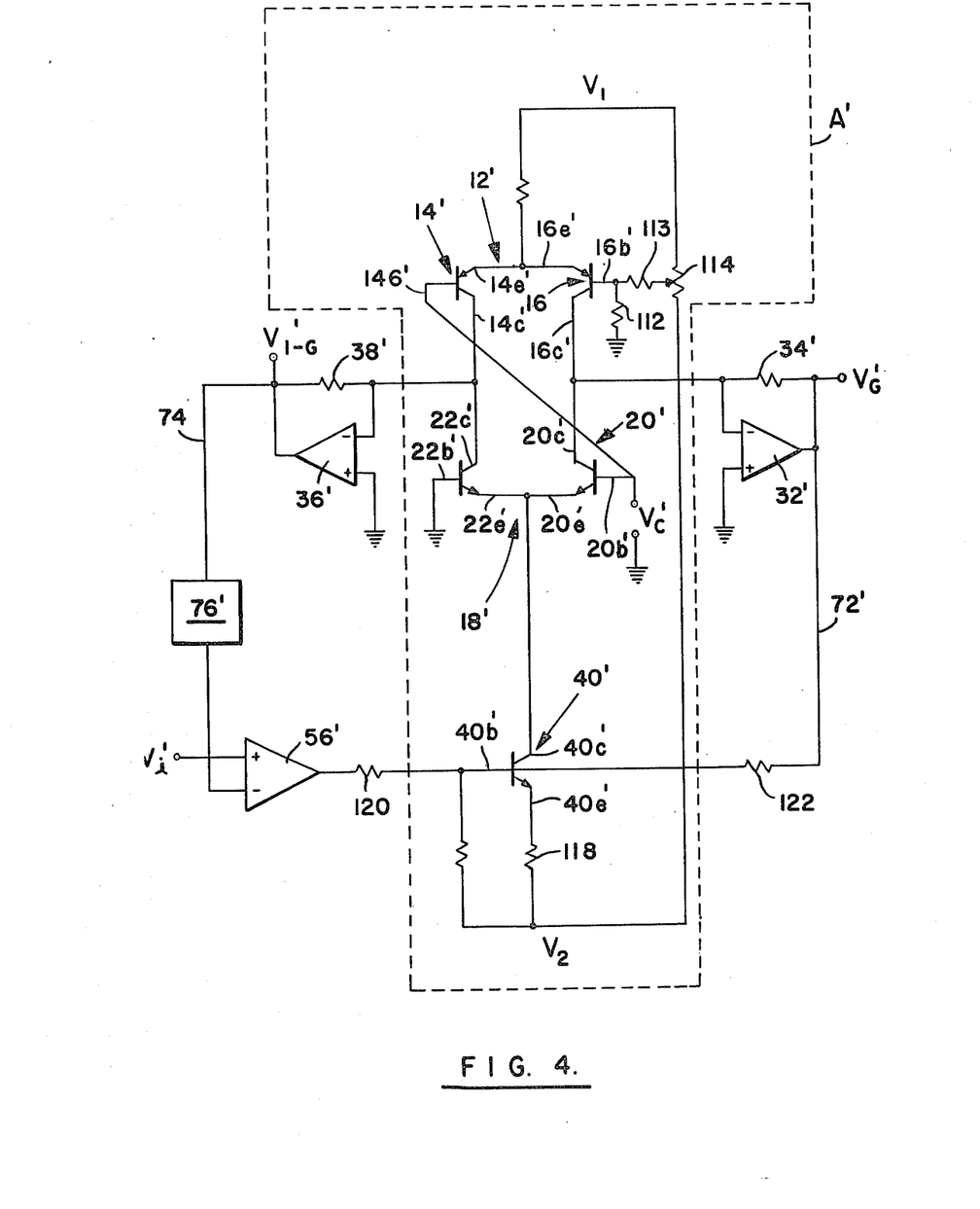
FIG. 4 is a schematic representation of a circuit embodying aspects of the invention implemented with a mixture of NPN and PNP core transistors.
Figure 5:
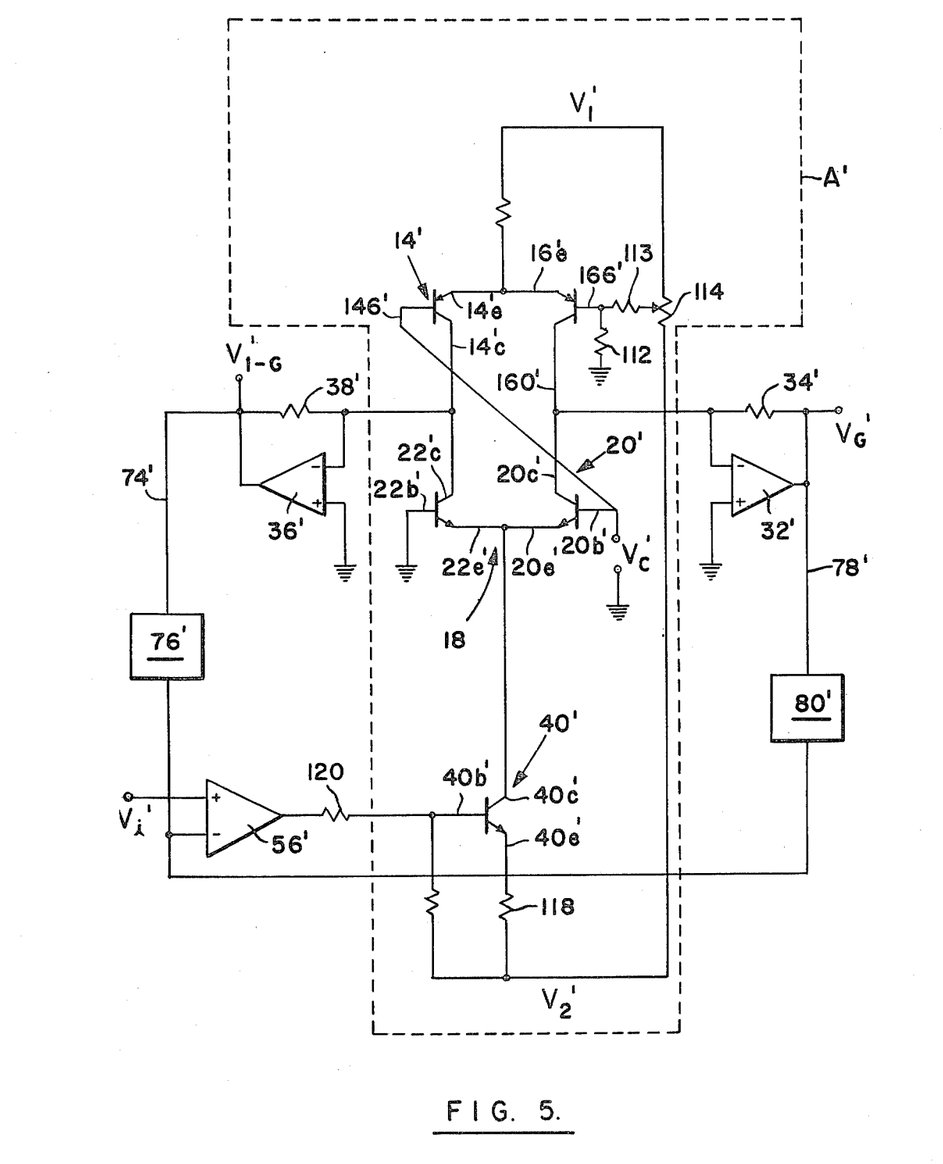
FIG. 5 is a schematic representation of another circuit embodying aspects of the invention implemented with a mixture of NPN and PNP core transistors.

FIG. 4 illustrates schematically a circuit manifesting the invention implemented with a mixture of NPN and PNP type transistors. In FIGS. 4 and 5, prime notation denotes elements which are analogous to correspondingly numbered elements, lacking the prime notation, appearing in FIGS. 1, 2 and 3. The first and second pairs of transistors are again designated generally 12' and 18' with first transistor of pair 12' designated generally 14' and second transistor of pair 12' designated generally 16'. Likewise, the first transistor of second pair 18' is designated generally 20' and the second transistor of second pair 18' is designated generally 22'. Respective bases, emitters and collectors of the transistors are denoted by respective letters b, e and c.

Collector 16c' of second transistor 16' of first pair 12' is connected to collector 20c' of first transistor 20' of second pair 18'. Similarly, collector 14c' of first transistor 14' of first pair 12' is connected to collector 22c' of second transistor 22' of second pair 18'. Connected collectors 16c' and 20c' are connected for input to a first amplifier 32'; the signal at the output of first amplifier 32' defines the output voltage $V_G'$ of the circuit element which is proportional to the gain of the circuit element. A resistor 34' provides feedback of the output of amplifier 32' for stabilization thereof. The positive input terminal of amplifier 32' is connected to ground.

The sum of currents from connected collectors 14c', 22c' is provided as a second intermediate output to second differential amplifier 36' which, in combination with feedback resistor 38', converts the second intermediate output from collectors 14c', 22c' to a second output voltage $V_{1-G}'$ proportional to a constant minus G; resistor 38' provides feedback of $V_{1-G}'$ to the negative input terminal of amplifier 36'. The positive input terminal of amplifier 32' is connected to ground. Gain G of the FIG. 4 circuit is the ratio of the emitter current of first transistor 20' to the sum of the emitter currents of first and second transistors 20', 22' defining second pair 18'. The ratio of emitter current of transistor 16' to the sum of the emitter currents for transistors 14', 16' defining first pair 12' is also equal to G.

Base 14b' of first transistor 14' of first pair 12' is connected to base 20b' of first transistor 20' of second pair 18' and these two bases are connected to an input control voltage $V_c'$. This control voltage controls gain of the circuit element. Base 22b' of second transistor 22' of second pair 18' is connected to a ground reference voltage while base 16b' of first transistor 16' of first pair 12' is connected to ground, via a resistor 112, and through resistor 113 to the tap of a variable resistor 114. Ends of variable resistor 114 are connected to respective reference voltages $V_1$, $V_2$.

Emitters 14e', 16e' of transistors 14', 16' of first pair 12' are connected together, as are emitters 20e', 22e' of transistors 20', 22' of second pair 18'. Connected emitters 20e', 22e' are connected to a current source defined by fifth transistor 40'; connection is made to the collector of fifth transistor 40'. Connected emitters 14e', 16e' are connected via resistor 116 to reference voltage $V_1$. Emitter 40e' of fifth transistor 40' is connected to reference voltage $V_2$ via resistor 118.

Fifth transistor 40' operates in response to a signal supplied to the base 40b' thereof from a third differential amplifier 56' via a resistor 120.

A portion of the circuit of FIG. 4 enclosed by dotted line A' is analogous to the portion of the circuit enclosed by dotted line A in FIG. 1 and has operating characteristics analogous thereto.

A line 72' may be provided to feedback output voltage $V_G'$ to base 40b' of fifth transistor 40' via resistor 122. Use of feedback as provided by line 72' produces the same benefits as discussed above with respect to use of line 72 in FIG. 1.

A line 74' may feed back output voltage $V_{1-G}'$ via a feedback connection 76' to third amplifier 56'. Feedback connection 76' may be of the same type as discussed above with respect to connection 76 in FIGS. 1, 2 and 3. Line 74' in combination with feedback connection 76' provides the same benefits as discussed above with respect to line 74 and feedback connection 76 in FIGS. 1, 2 and 3.

FIG. 5 illustrates another circuit manifesting aspects of the invention, where the circuit is configured using a mix of NPN and PNP type transistors. In the circuit of FIG. 5, line 72' has been eliminated and replaced by a line 78' and a feedback connection 80' providing further modification of the input signal to amplifier 56'. Feedback connection 80' may be of the same type as discussed above with respect to connection 80 in FIGS. 2 and 3. $V_G$ is no longer provided directly to the base of fifth transistor 40' but rather is fed back as input to fifth amplifier 56'. This additional feedback path provided by line 78' and feedback connection 80' provides the same benefits as discussed with respect to line 78 and feedback connection 80 in FIGS. 2 and 3.

While the circuit diagrams of FIGS. 1 through 5 manifesting aspects of the invention disclose use of differential amplifiers and/or transistors and/or resistors as means for drawing respective currents from respective connected emitters, any suitable network of active and/or passive elements could be substituted to provide the means for drawing the respective currents from the respective connected emitters.

I claim the following:

1. A voltage controlled element comprising:
   a. first and second pairs of transistors, each of said transistors having a base, an emitter and a collector;
   b. second transistors of each pair having their bases connected together;
   c. first transistors of each pair having their bases connected together;
   a control voltage being apppied between said respective first and second connected pairs of bases;
   d. emitters of said transistors of said respective pairs being connected together, respective paired emitters being connected to means for drawing current therefrom;
   e. said current drawing means drawing respective currents from said respective connected emitters, the difference between said respective currents varying according to a signal input to said element and a signal from said collectors of said first transistors.

2. The voltage controlled element of claim 1 wherein said signal from collectors of said first transistors of said pairs varies according to the difference of collector currents of said first transistors of said respective pairs.

3. The voltage controlled element of claim 2 wherein said current drawing means draws respective currents from said respective connected emitters, with the difference between the respective currents varying additionally according to a signal from collectors of said second transistors of said pairs.

4. The voltage controlled element of claim 3 wherein said signal from collectors of said first transistor of said pairs is combined with said signal from collectors of said second transistors of said pairs prior to input to said current drawing means.

5. The voltage controlled element of claim 1 wherein said current drawing means includes means for drawing current from either part of said connected emitters in response to current from the remaining pair of connected emitters.

6. The voltage controlled element of claim 5 wherein said means for drawing current from either pair of said connected emitters in response to current from the remaining pair of connected emitters is a passive network of diodes and resistors.

7. The voltage controlled element of claim 5 further comprising means for applying to said control voltage a corrective voltage derived from said signal from said collectors of first transistors of said pairs and from the larger of said currents flowing from said pairs of connected emitters.

8. A voltage controlled element comprising:
   a. first and second pairs of transistors, each of said transistors having a base; an emitter and a collector, said transistors all being of common type;
   b. second transistors of said pairs having their bases connected;
   c. emitters of transistors of said respective pairs being connected, respective connected emitters being connected to respective current sources;
   d. said respective current sources drawing respective currents from said respective connected emitters differing by an amount proportional to a signal input to said current sources;
   e. bases of first transistors of said respective pairs having common control voltage applied thereto thereby to produce a voltage difference between said connected pairs of bases;
   f. first amplifier means receiving as input signals from said collectors of said first transistors of said pairs, output of said first amplifier means defining a first output of said element proportional to the product of gain of said element, as defined by said control voltage, and an input voltage;
   g. second amplifier means receiving as input signals from said collectors of said second transistors of said pairs, output of said second amplifier means defining a second output of said element proportional to the product of a constant minus gain of said element, as defined by said control voltage, and said input voltage;
   h. means for producing said signal input to said respective current sources in response to said input voltage, comprising:
      i. third amplifier means producing an output signal received by said current source connected to said emitters of said first pair of transistors; and
      ii. fourth amplifier means producing an output signal received by said current source connected to said connected emitters of said second pair of transistors;
   wherein said input voltage is applied to both said third and fourth amplifier means.

9. A voltage controlled multiplier circuit for producing an output voltage in response to an input voltage, gain thereof being proportional to a control voltage input thereto, comprising:
   a. first and second pairs of transistors, each of said transistors having a base, an emitter and a collector;
   b. second transistors of each pair having their bases connected;
   c. emitters of transistors of said respective pairs being connected, respective connected emitters being connected to respective current sources;
   d. said respective current sources drawing respective currents from said respective connected emitters differing by an amount proportional to a signal input to said current sources;
   e. bases of first transistors of said respective pairs having said control voltage commonly applied thereto thereby to produce a voltage difference between said connected pairs of bases;
   f. first amplifier means receiving as input signals from said collectors of said first transistors of said pairs, output of said first amplifier means defining a first output voltage of said circuit proportional to the product of gain of said circuit, as defined by said control voltage, and an input voltage;

g. second amplifier means receiving as input signals from said collectors of said second transistors of said pairs, output of said second amplifier means defining a second output voltage of said circuit proportional to the product of a constant minus gain of said circuit, as defined by said control voltage, and said input voltage; and h. means for producing said signal input to said current sources in response to a combination of said input voltage and output of said first amplifier means, comprising:
  i. third amplifier means producing an output signal received by said current source connected to said connected emitters of said first pair of transistors; and
  ii. fourth amplfier means producing an output signal received by said current source connected to said connected emitters of said second pair of transistors;

wherein said input voltage and said output of said first amplifier means are applied as input to both said third and fourth amplifier means.

10. The circuit of claim 9 further comprising fifth amplifier means, receiving said input voltage and output from said second amplifier means; wherein output of said fifth amplifier means is applied as input to both said third and fourth amplifier means.

11. A voltage controlled multiplier circuit for producing an output voltage in response to an input voltage, gain thereof being proportional to a control voltage input thereto, comprising:
  a. first and second pairs of transistors, each of said transistors having a base, an emitter and a collector;
  b. second transistors of said pairs having their bases connected;
  c. emitters of transistor of said respective pairs being connected together, respective connected emitters being connected to respective current sources;
  d. said respective current sources drawing respective currents from said respective connected emitters differing by an amount proportional to a signal input to said current sources;
  e. bases of first transistors of said respective pairs having said control voltage commonly applied thereto thereby to produce a voltage difference between said connected pairs of bases;
  f. first amplifier means receiving as input signals from said collectors of said first transistors of said pairs; output of said first amplifier means defining a first output voltage of said circuit proportional to the product of gain of said circuit, as defined by said control voltage, and an input voltage;
  g. second amplifier means receiving as input signals from said collectors of said second transistors of said pairs, output of said second amplifier means defining a second output voltage proportional to the product of a constant minus gain of said circuit, as defined by said control voltage, and said input voltage;
  h. means for producing said signal input to said current sources in response to a combination of said input voltage and output of said first and second amplifier means, comprising:
    i. third amplifier means producing an output signal received by said current source connected to said connected emitters of said first pair of transistors;
    ii. fourth amplifier means producing an output signal received by said current source connected to said connected emitters of said second pair of transistors;
    iii. fifth amplifier means producing an output signal received by said third and fourth amplifier means in response to said input voltage and a signal produced by combining output from said first and second amplifiers.

12. A voltage controlled multiplier circuit for producing an output voltage in response to an input voltage, gain thereof being proportional to a control voltage input thereto, comprising:
  a. first and second pairs of transistors, each of said transistors having a base, an emitter and a collector;
  b. second transistors of said pairs having their bases connected;
  c. emitters of transistors of said respective pairs being connected together;
  d. bases of first transistors of said respective pairs having said control voltage commonly applied thereto;
  e. first amplifier means receiving as input signals from said collectors of said first transistors of said pairs, output of said first amplifier means defining a first output voltage of said circuit proportional to the product of gain of said circuit, as defined by said control voltage, and an input voltage;
  f. second amplifier means receiving as input signals from said collectors of said second transistors of said pairs, output of said second amplifier means defining a second output voltage proportional to the product of a constant minus gain of said circuit, as defined by said control voltage, and said input voltage;
  g. means for applying signals to respective connected emitters of respective pairs of transistors comprising:
    i. third amplifier means producing an output signal received by said connected emitters of said first pair of transistors;
    ii. fourth amplifier means producing an output signal received by said connected emitters of said second pair of transistors;
    iii. fifth amplifier means producing an output signal received as input by said third and fourth amplifier means in response to said input voltage and a signal produced by combining output of said first and second amplifier means;

wherein said fourth amplifier means operates in response to third and fourth reference voltages and output of said fifth amplifier means; wherein said third amplifier means operates in response to said third reference voltage and outputs of said fourth and fifth amplifier means.

13. The voltage controlled multiplier circuit of claim 12 further comprising means for applying a signal produced from a combination of outputs from said first, second, third and fourth amplifier means to said commonly connected bases of first transistors of said pairs.

14. The circuit of claim 8, 9, 11 or 12 wherein all of said transistors are NPN-type.

15. The circuit of claim 8, 9, 11 or 12 wherein all of said transistors are PNP-type.

16. The circuit of claim 14 wherein all of said transistors are on a common substrate.

17. A voltage controlled multiplier circuit for producing first and second output voltages in response to an input voltage, a control voltage supplied thereto defining circuit again, the product of circuit gain and said input voltage defining said first output voltage, the difference between a constant and said circuit gain defining said second output voltage, comprising:
   a. first and second pairs of NPN-type transistors, each transistor having a base, an emitter and a collector;
   b. second transistors of each pair having their bases grounded;
   c. emitters of transistors of said respective pairs being connected together;
   d. bases of first transistors of said pairs having said control voltage commonly applied thereto;
   e. a first differential amplifier receiving at respective positive and negative input terminals currents from said collectors of said first transistors of said respective pairs, output of said first differential amplifier defining a first output voltage of said circuit equal to the product of gain of said circuit and said input voltage;
   f. a second differential amplifier receiving at respective positive and negative input terminals currents from said collectors of said second transistors of said respective pairs, output of said second differential amplifier defining a second output voltage of said circuit equal to the product of a constant minus gain of said circuit and said input voltage;
   g. means for drawing current from respective connected emitters of respective pairs of transistors, comprising:
      i. a third differential amplifier providing output to said connected emitters of said first transistor pair;
      ii. a fourth differential amplifier providing output to said connected emitters of said second transistor pair;
      iii. a fifth differential amplifier providing output to respective positive and negative input terminals of said third and fourth differential amplifiers in response to said input voltage and combined output from said first and second differential amplifiers;
      wherein said fourth differential amplifier receives a third reference voltage at the positive input terminal thereof and a fourth reference voltage and output from said fifth amplifier means at the negative input terminal thereof;
      wherein said third differential amplifier receives at the positive input terminal thereof the signal input to the negative terminal of said fourth differential amplifier and at the negative input terminal thereof receives output of said fourth differential amplifier;
   h. means interposed between said outputs of said third and fourth differential amplifiers of said current drawing means and said respective connected emitters of said respective pairs of transistors, for maintaining current through said respective pairs of emitters, comprising:
      i. a first pair of resistive means, respective means thereof connected to said connected emitters of said respective transistor pairs;
      output from said third and fourth differential amplifiers respectively being connected intermediately said respective resistive means of said first pair and said respective connected emitter pairs;
      ii. a pair of diodes for permitting current flow from intermediate respective resistive means of said first pair to said respective outputs of said third and fourth differential amplifier means;
      iii. a second pair of resistive means interposed respectively between said third and fourth differential amplifier outputs and said connection points thereof intermediate said respective resistive means of said first pair and said respective connected emitter pairs;
      said diodes being connected to said respective outputs of said third and fourth differential amplifier means intermediate said respective amplifier means and said respective resistors of said second pair.

18. A voltage controlled element comprising:
   a. first and second pairs of transistors, each transistor having a base, an emitter and a collector, transistors of said first and second pairs being of opposite types;
   b. bases of first transistors of said pairs being connected; a control voltage being applied to said connected bases of said first transistors of said pairs, producing a voltage difference between said connected bases of said first transistors of said pairs and based of second transistors of said pairs;
   c. emitters of said transistors of said respective pairs being connected together;
   d. said emitters of said second pair being connected to means for drawing current therefrom;
   e. said current drawing means drawing current from said connected emitters of said second pair of transistors according to a signal from connection of said collector of said second transistor of said first pair and said collector of said first transistor of said second pair and a signal input to said element.

19. The voltage controlled element of claim 18 wherein said signal from said connected collectors of said second transistor of said first pair and said first transistor of said second pair varies according to current flowing between said connected collectors.

20. The voltage controlled element of claim 18 wherein said current drawing means draws current from said connected emitters of said transistors of said second pair according to a signal from connected collectors of said second transistor of said first pair and said first transistor of said second pair, a signal from connected collectors of said first transistor of said first pair and said second transistor of said second pair and a signal input to said element.

21. The voltage controlled element of claim 20 wherein said signal from said connected collectors of said second transistor of said first pair and said first transistor of said second pair is combined with said signal from said connected collectors of said first transistor of said first pair and said second transistor of said second pair prior to input to said current drawing means.

22. A voltage controlled element comprising:
   a. first and second pairs of transistors, each transistor having a base, an emitter, and a collector, transistors of said first pair being of type opposite that of transistors of said second pair,
   b. bases of first transistors of said pairs being connected;

a control voltage being applied to said connected bases of said first transistors of said pairs, producing a voltage difference between said connected bases of said first transistors of said pairs and bases of second transistors of said pairs;
   c. emitters of said transistors of said respective pairs being connected together;
   d. a current source drawing current from said respective connected emitters of said second pair of transistors, operating in response to an input voltage;
   e. emitters of first transistors of said first pair being connected together and to means for supplying current thereto;
   f. said collector of said first transistor of said first pair being connected to said collector of said second transistor of said second pair;
   g. said collector of said second transistor of said first pair being connected to said collector of said first transistor of said second pair;
   h. first amplifier means receiving as input signals from said connected collectors of said second transistor of said first pair and said first transistor of said second pair, output of said first amplifier means defining a first output of said element proportional to the product of gain of said element, as defined by said control voltage, and said input voltage;
   i. second amplifier means receiving as input signals from said connected collectors of said first transistor of said first ppair and said second transistor of said second pair, output of said second amplifier means defining a second output of said element proportional to the product of a constant minus gain of said element, as defined by said control voltage, and said input voltage;
   j. means for producing said signal input to said current source in response to said input voltage, comprising a third amplifier means producing an output signal received by said current source.

23. The voltage controlled element of claim 22 wherein said current source is a transistor having its collector connected to said connected emitters of transistors of said second pair, having its base connected to said third amplifier means and having its emitter connected to a second reference voltage.

24. The voltage controlled element of claim 23 further comprising feedback means for applying output of said first amplifier means to the base of said transistor functioning as a current source.

25. The voltage controlled element of claim 24 further comprising means for applying output of said second amplifier means as input to said third amplifier means.

26. The voltage controlled element of claim 23 further comprising feedback means for applying the output of said first and second amplifiers as input to said third amplifiers in addition to said input voltage.

27. The voltage controlled element of claim 26 wherein outputs from said first and second amplifiers are combined prior to input to said third amplifier.

28. A voltage controlled multiplier circuit for producing first and second output voltages in response to an input voltage, a control voltage supplied thereto defining circuit gain, the product of circuit gain and said input voltage defining said first output voltage, the difference between a constant and said circuit gain defining said second output voltage, comprising:
   a. first and second pairs of transistors, each transistor having a base, an emitter and a collector, transistors of said first pair being PNP type and transistors of said second pair being NPN type;
   b. second transistors of each pair having their bases grounded;
   c. emitters of transistors of said respective pairs being connected together;
   d. bases of first transistors of said pairs having said control voltage commonly applied thereto;
   e. said collector of said second transistor of said first pair being connected with said collector of said first transistor of said second pair;
   f. said collector of said first transistor of said first pair being connected to said collector of said second transistor of said second pair;
   g. said emitters of said transistors of said first pair being connected to a first reference voltage via resistive means;
   h. a first differential amplifier receiving at a negative input terminal thereof current from said connected collectors of said second transistor of said first pair and said first transistor of said second pair, a positive input terminal of said first differential amplifier being grounded, output of said first differential amplifier defining first output voltage of said circuit equal to the product of gain of said circuit and said input voltage;
   i. a second differential amplifier receiving at a negative input terminal thereof current from said connected collectors of said first transistor of said first pair and said second transistor of said second pair, a positive input terminal to said second differential amplifier being grounded; output of said second differential amplifier defining a second output voltage of said circuit equal to the product of a constant minus gain of said circuit and said input voltage;
   j. means for drawing current from said connected emitters of said transistors of said second pair, comprising:
      i. a fifth transistor having its collector connected to said connected emitters of said transistors of said second pair, having its emitter connected to a second reference voltage via resistive means;
      ii. a third differential amplifier having its output connected to base of said fifth transistor, receiving as an input said input voltage to said element;
   k. first feedback means supplying output of said first differential amplifier as input to said third differential amplifier;
   l. second feedback means for supplying output of said second differential amplifier as input to said third differential amplifier;
wherein said first and second feedback means are connected to the negative input terminal of said third differential amplifier and said input voltage is connected to the positive input terminal of said third differential amplifier.

* * * * *